(12) United States Patent
Kimmelmann (10) Patent No.: US 7,560,889 B2
(45) Date of Patent: Jul. 14, 2009

(54) DIGITAL SERVO SYSTEM WITH MOVING AVERAGE FILTER

(75) Inventor: Stefan Kimmelmann, VS-Pfaffenweiler (DE)

(73) Assignee: Thomson Licensing, Boulogne Billancourt (FR)

( * ) Notice: Subject to any disclaimer, the term of this patent is extended or adjusted under 35 U.S.C. 154(b) by 167 days.

(21) Appl. No.: 11/473,766

(22) Filed: Jun. 23, 2006

(65) Prior Publication Data

US 2007/0001640 A1      Jan. 4, 2007

(30) Foreign Application Priority Data

Jun. 30, 2005   (EP)   ................................ 05014141

(51) Int. Cl.
 *G05B 5/01*   (2006.01)
(52) U.S. Cl. ...................... 318/611; 318/600; 318/615; 318/636
(58) Field of Classification Search ................ 318/600, 318/611, 615, 636
 See application file for complete search history.

(56) References Cited

U.S. PATENT DOCUMENTS

| | | | |
|---|---|---|---|
| 4,990,840 A * | 2/1991 | Migda | 318/571 |
| 5,325,247 A * | 6/1994 | Ehrlich et al. | 360/78.09 |
| 5,610,487 A | 3/1997 | Hutsell | |
| 6,766,153 B2 * | 7/2004 | Kozak et al. | 455/232.1 |
| 7,079,459 B2 * | 7/2006 | Watt et al. | 369/47.39 |
| 2002/0113897 A1 | 8/2002 | Menkhoff | |

FOREIGN PATENT DOCUMENTS

EP          0626687        11/1994

OTHER PUBLICATIONS

Wilson D: "16-Bit DSP Servo Control with the MC68HC16ZI" Microprocessors and Microsystems, IPC Business Press Ltd. London, GB, vol. 18, No. 2, Mar. 1, 1994, pp. 109-117 XP000440130 ISSN: 0141-9331 *pp. 109-117, Figures 1, 5, 8*.
Prasad K et al: "VLSI Implementation of Digital Compensators and Predictive PID Controllers" Electro/94 International Conference Proceedings, Combined volumes. Boston, MA USA, May 10-12, 1994, New York, NY USA, IEEE, US, May 10, 1994, pp. 670-688 XP010149486 ISBN: 0-7803-2630-X *The Whole Document*.
Copy of Search Report dated Dec. 8, 2005.

* cited by examiner

*Primary Examiner*—T C Patel
*Assistant Examiner*—Renata McCloud
(74) *Attorney, Agent, or Firm*—Robert D. Shedd; Harvey D. Fried; Patricia Verlangieri (57) ABSTRACT

The invention relates to a method and an arrangement for a digital servo system with moving average filter (Amovavf 1, Amovavf 2),which is used as an input filter for a digital signal processor of the servo system to shorten processing delay, which improves the stability of the control loop and/or allow a fast servo signal processing, which improve the overall servo signal control performance. Said input filter provides average values of samples provided from an analog digital converter (ADC) at a frequency corresponding to a sample frequency (fADC) of the analog digital converter (ADC) and has an adjustable filter length (n), which is determined according to a quality of detector signals indicating a deviation from a target of servo means of the servo system. The invention is e.g. applicable for a fast digital servo system in an optical disc drive.

11 Claims, 9 Drawing Sheets

DIGITAL SERVO SYSTEM WITH MOVING AVERAGE FILTER

This application claims the benefit, under 35 U.S.C. § 119 of French Patent Application 0501441, filed Jun. 30, 2005.

FIELD OF THE INVENTION

The present inventions relates to a method and an arrangement for a digital servo system and, in particular, to a digital servo system in an optical disc drive with moving average filter.

BACKGROUND OF THE INVENTION

A conventional optical disc drive comprises at least a focus servo and a track servo to control a laser spot in axial and radial direction to keep the spot on track. The spot is used to read out data from or to write data into an information layer of the optical disc. Higher rotation speeds of the disc and more capacity on one information layer as e.g. by the use of a blue laser require a faster servo control system and an improved phase margin. The phase margin is a measure of how close the phase of the open control loop gain is to −180 degrees, when the magnitude of the open loop gain is one. The bandwidth of the control loop has to be increased to guarantee a proper operation in disc drive servo systems with high rotation speeds and thin tracks. To increase the bandwidth it is necessary to reduce all process delays to a minimum. Standard servo controllers use a digital signal processor to calculate the output values of the servo control loops. A digital signal processor core is used to do the filter calculations because in such a core there is always a special so-called ALU. ALU is the abbreviation for arithmetic logic unit, which is able to perform MAC operations in just one clock cycle. The abbreviation MAC is used for Multiply and Accumulate. The calculation is done one control loop after the other in the digital signal processor, which decreases the phase margin of the second calculated one. A second delay factor is caused by a decimation filter in front of a digital signal processor, which calculates with a predetermined number of samples an average value at a low frequency and outputs the result after said predetermined number of samples has been received. Therefore, it occurs disadvantageously a signal processing delay caused by the decimation filter and a waiting period until a second average value, which is already an old or delayed one, can be used in the second control loop.

SUMMARY OF THE INVENTION

It is an aspect of the invention to provide a method and an arrangement for a digital servo system having a short processing delay, which improve the stability of the control loop and/or allow a fast servo signal processing, which improve the overall servo control performance.

This is solved by the features in independent claims and the features in dependent claims disclose features of specific embodiments.

It is an aspect of the invention to provide continuously updated average filter values for a digital signal processor for a fast signal processing in a control loop. A specific input filter for a servo signal processing unit is selected to solve said problem. Input filter, which solve the problem are filter with a recursive or a non-recursive filter structure or filter having a similar behaviour. The sum of the incoming values has to be divided by the filter length to provide an average value of samples provided from an analog digital converter. To make this division easy to handle a filter length, which is a multiple of two is preferred. Filter having a recursive or non-recursive filter structures provide with every incoming value an updated output value. The filter output rate corresponds to the sample frequency of the analog digital converter and an adjustable moving average filter is selected to decrease the delay time whenever it is possible.

According to an exemplary embodiment for an optical disc drive servo system, an error signal value in the servo control loop as e.g. a track or focus error signal is analog digital converted and applied to an input filter of a servo signal processing unit, wherein said input filter is an average filter. The delay of an average filter is directly dependent on the filter length m. That means, that filtered values are available at every clock cycle of the analog digital converter and a delay depends only from an adjustable length of said moving average filter. The filter length is adjustable and can be reduced or increased according to the requirements, which e.g. are dependent on the occurrence of defects as dropouts or scratches detected from the recording medium. After said filter value calculation a first digital signal processor output value is calculated with the loaded averaged input value, which is provided with a data rate, which corresponds to the sample frequency of the analog digital converter. That means that with every sample of the analog digital converter an updated average value is available for a processing in the digital signal processor. The servo signal processing unit provides an output value for the servo in the servo control loop to reduce the detected deviation and error respectively.

In accordance with a further aspect of the invention, less processing delay in the servo control system is achieved by a digital signal processor with pre-processing old control states. A digital signal processor core wherein calculation results can be stored for further use and a pre-processing of old control states is used to reduce the duration, which normally is required for a calculation of control filter values or so-called control states. This is achieved by storing previously calculated control filter values and using said values for a fast calculation of a control output value of the digital signal processor. That means that at first a control output value of the digital signal processor is calculated and control filter states are calculated later on. Said later on calculated control filter states are stored and used for a next incoming value, which has to be processed in the control loop. That means that old control states of the digital signal processor are pre-processed for an immediately use for an incoming value, which has to be processed by the digital signal processor. The duration, which a digital signal processor usually needs to provide a control output value, is in such a way reduced. All calculation results for which an old or previous input value is used can be stored in one or more memory locations of the digital signal processor for a fast use or a one step calculation of a control output value of the digital signal processor from an incoming value. The processing of old control states in the digital signal has no negative influence to the control loop, because changes of the overall control characteristic of a digital signal processor occur at a much lower rate than an update of the values, which are processed in the control loop.

As soon as a control output value is provided by said digital signal processor it will be digital analog converted and via an amplifier sent to a control means, which corrects a detected deviation from a target to which said control means shall be controlled.

During a start up or so-called initialisation phase, predetermined control filter values are used, which immediately after the first incoming value are substituted by control filter states calculated from said incoming value. Said combination of an input filter, which continuously provides updated average filter values for said digital signal processor at e.g. a filter output rate, which corresponds to the sample frequency of the analog digital converter with a digital signal processor, which pre-processes old control states to provide in a one step calculation a control output value of the digital signal processor provides a digital servo system having a short processing delay and filter delay, which improve the stability of the control loop and/or allow a fast servo signal processing, which improve the overall servo control performance. For a better understanding of the invention, an exemplary embodiment is specified in the following description with reference to the figures. It is understood that the invention is not limited to the exemplary embodiment and that specified features can also expediently be combined and/or modified without departing from the scope of the present invention.

BRIEF DESCRIPTION OF THE DRAWINGS

The invention will now be described with reference to the accompanying drawings, in which.

DETAILED DESCRIPTION OF THE PREFERRED EMBODIMENTS

The figures are purely diagrammatic and not drawn true to scale. Some dimensions have been particularly exaggerated for greater clarity and corresponding parts have been given the same reference numerals as much as possible.

Figure 1:
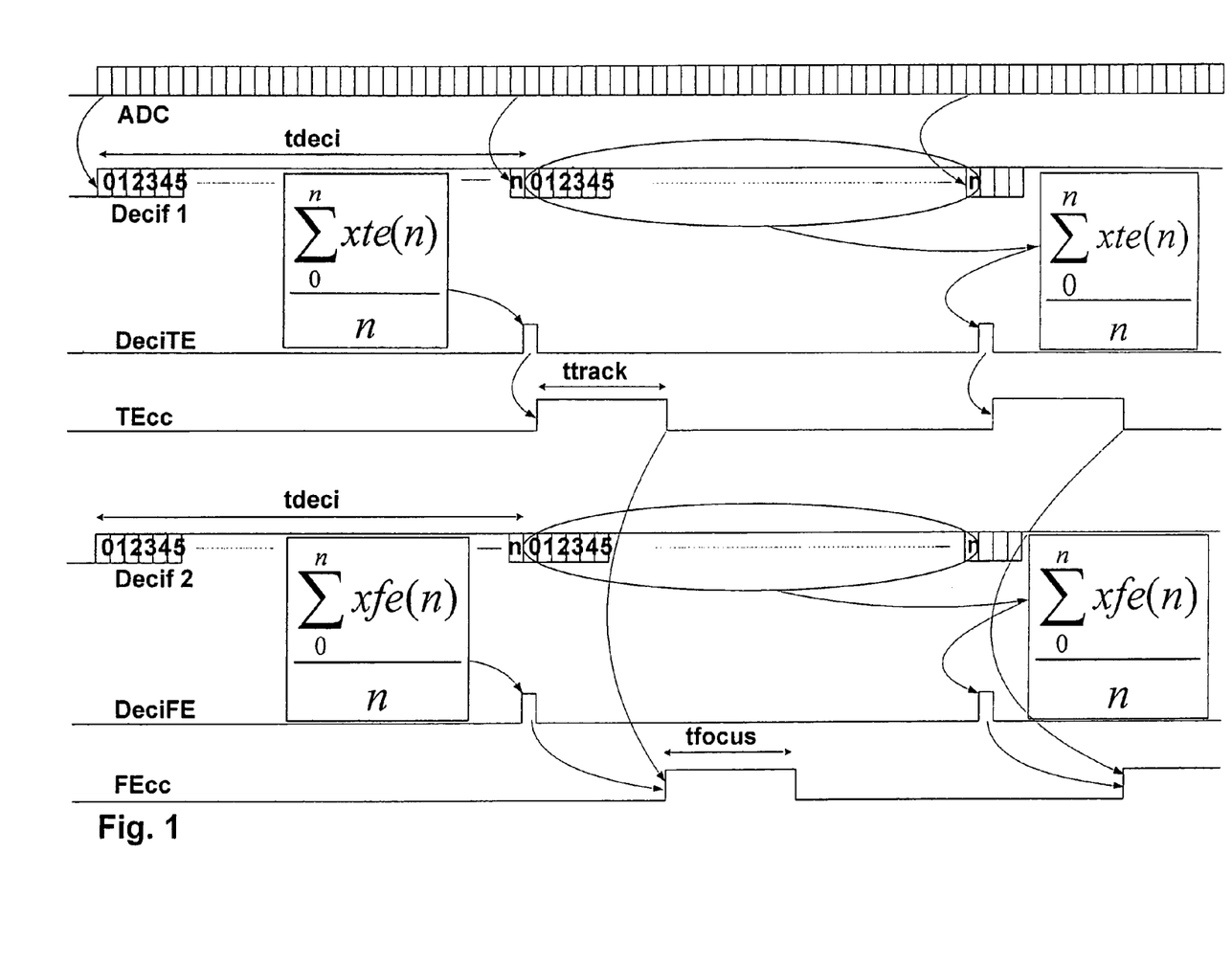
FIG. 1 is a schematic of a timing diagram of a prior art servo control system.

FIG. 1 shows a timing diagram of a prior art servo control system using decimation filters Decif 1 and Decif 2, in which an output value DeciTE of a first decimation filter Decif 1 is used for a control filter calculation in a digital signal processor DSP of a digital servo signal processing unit SPU. Said output value of a first decimation filter Decif 1 is e.g. a decimation track error value DeciTE and a second one, which is e.g. a decimation focus error value DeciFE. The stored value DeciFE waits to be used for processing until the first control filter calculation for a first control loop in said digital signal processor is finished. Such a servo system uses the same sampling clock for the first and a second decimation filter Decif 1, Decif 2 to get error signal values from said decimation filters, stores the error value in a memory and uses these error signal values later on to calculate the different control loops. Standard decimation filters deliver output values DeciTE and DeciFE according to a predetermined decimation time frame tdeci, as shown in FIG. 1. The purpose of a decimation filter is to sum up a predetermined number n of input samples, as e.g. track error signal input samples xte(n) or focus error signal input samples xfe(n) provided by an analog digital converter ADC, to calculate an average value and to send a decimation track error value DeciTE and a decimation focus error value DeciFE to a digital signal processor DSP or so-called controller. Afterwards, the next predetermined number n of input samples is processed and so on. A decimation filter Decif 1 or Decif 2 is a low-pass digital filter having an output sample rate less than a filter input sample rate. Decimation filters are filters which down-sample digitised detector signals to output signals prepared for a digital signal processor DSP. The effects of down-sampling in decimation filters include an averaging over several samples of each of the detector signals. This averaging provides a low-pass filtering function, higher accuracy and a higher resolution for signals which are actually read by the digital signal processor DSP. Although servo information signals are included in a high frequency signal detected from an optical disc OD, the servo information relates to much lower frequencies. It has been found that said decimation time frame tdeci of decimation filters Decif 1, Decif 2 and providing output results of said decimation process in a distance of said time frames tdeci as well as a duration ttrack and tfocus, which is necessary to calculate control filter values and to provide an control filter output value with a digital signal processor DSP cause a delay in a control loop of a servo system as shown in FIG. 1. At least two control loops are processed by a core of a digital signal processor DSP and the control loops are processed one after the other. Therefore, a calculation period FEcc for a control value of a second control loop follows a duration ttrack, required as calculation period TEcc to provide a control value for a first control loop. Although a decimation filter output value DeciFE for the second control loop at the same time as a decimation filter output value DeciTE for the first control loop is provided a processing for the second control loop takes place in the digital signal processor after a period of time corresponding to said duration ttrack. That means that an old decimation filter output value DeciFE will be processed in the digital signal processor and a control value for a second control loop will be provided after a further duration tfocus. Consequently, it occur a delay caused by the use of decimation filters Decif 1, Decif 2 and in addition a delay due to a duration ttrack, needed as calculation period TEcc in a digital signal processor DSP to provide a control value for a first control loop.

Especially in disc drive applications where the capacity on one information layer is increased as e.g. by the use of a blue laser in comparison to a DVD or CD a faster servo control is needed. Furthermore, higher and higher rotation speeds are requested for shorter recording times and providing higher data rates for reproducing in high quality. Such requests require speeding up the servo signal processing. In general, a single digital signal processor DSP shall be used to perform the filter calculations for more than one control loop. Mainly a focus servo and a track servo are used in optical disc drives to control a laser spot in axial and radial direction to keep the light spot in focus and in the middle of a track on an optical disc OD. This spot is used to read data from or to write data on an information layer of the optical disc OD. Standard controllers use a digital signal processor DSP to calculate the servo control loops. The calculation is done one control loop after the other. This decreases the phase margin of the second calculated one, because input signal sampling of both commonly takes place at the same time. A further delay is caused by the decimation filter in front of a digital signal processor DSP, which forms a so called controller, which executes filter calculations for more than one control loop. The decimation filter in front of the digital signal processor DSP calculates output values at a low frequency and provides said values periodically after a certain time frame. This is a disadvantage, because a value used for the second servo control loop is an old one and is provided with big delay as shown in FIG. 1.

Figure 2:
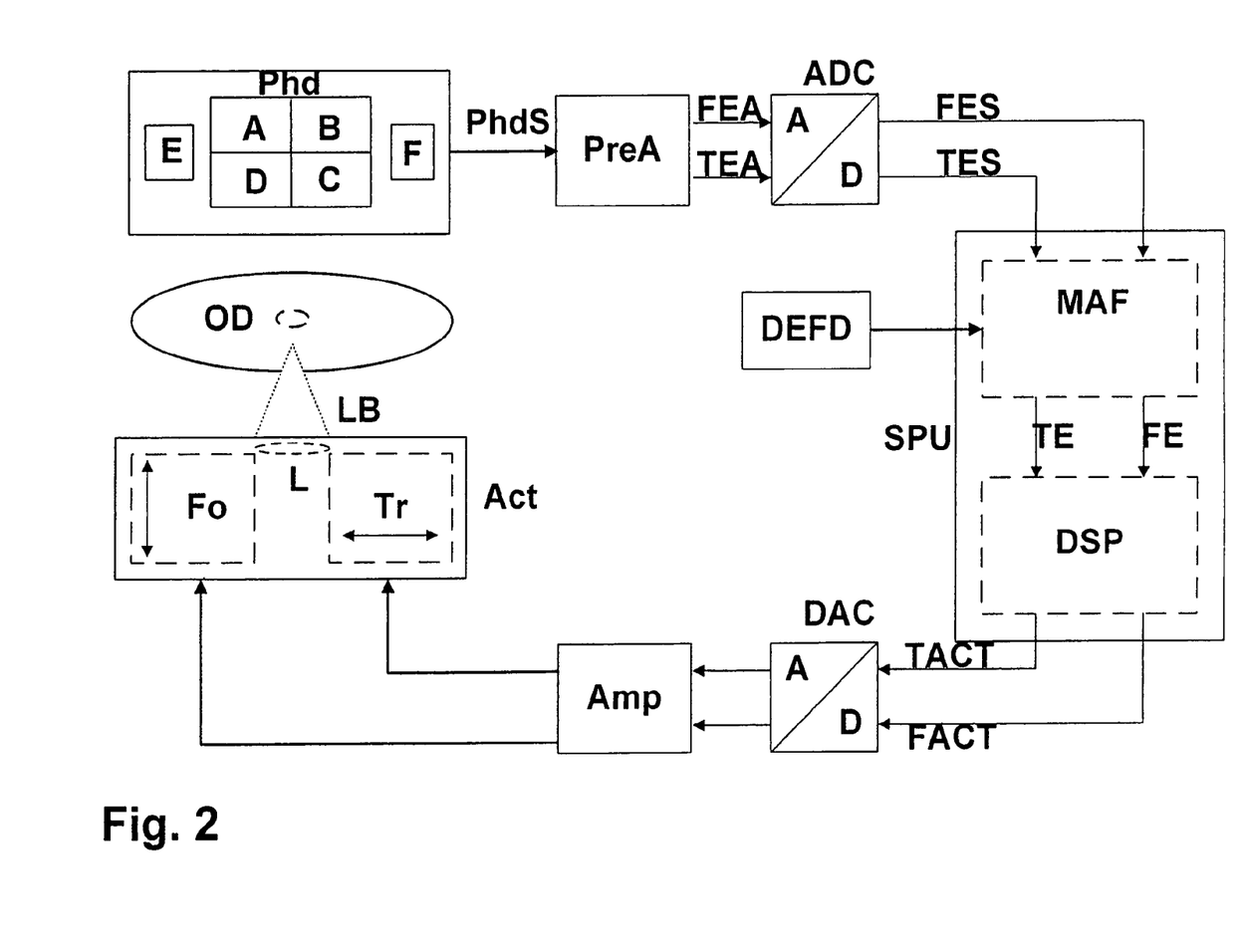
FIG. 2 is block diagram of a disc drive with a digital servo system according to the invention.
Figure 9:
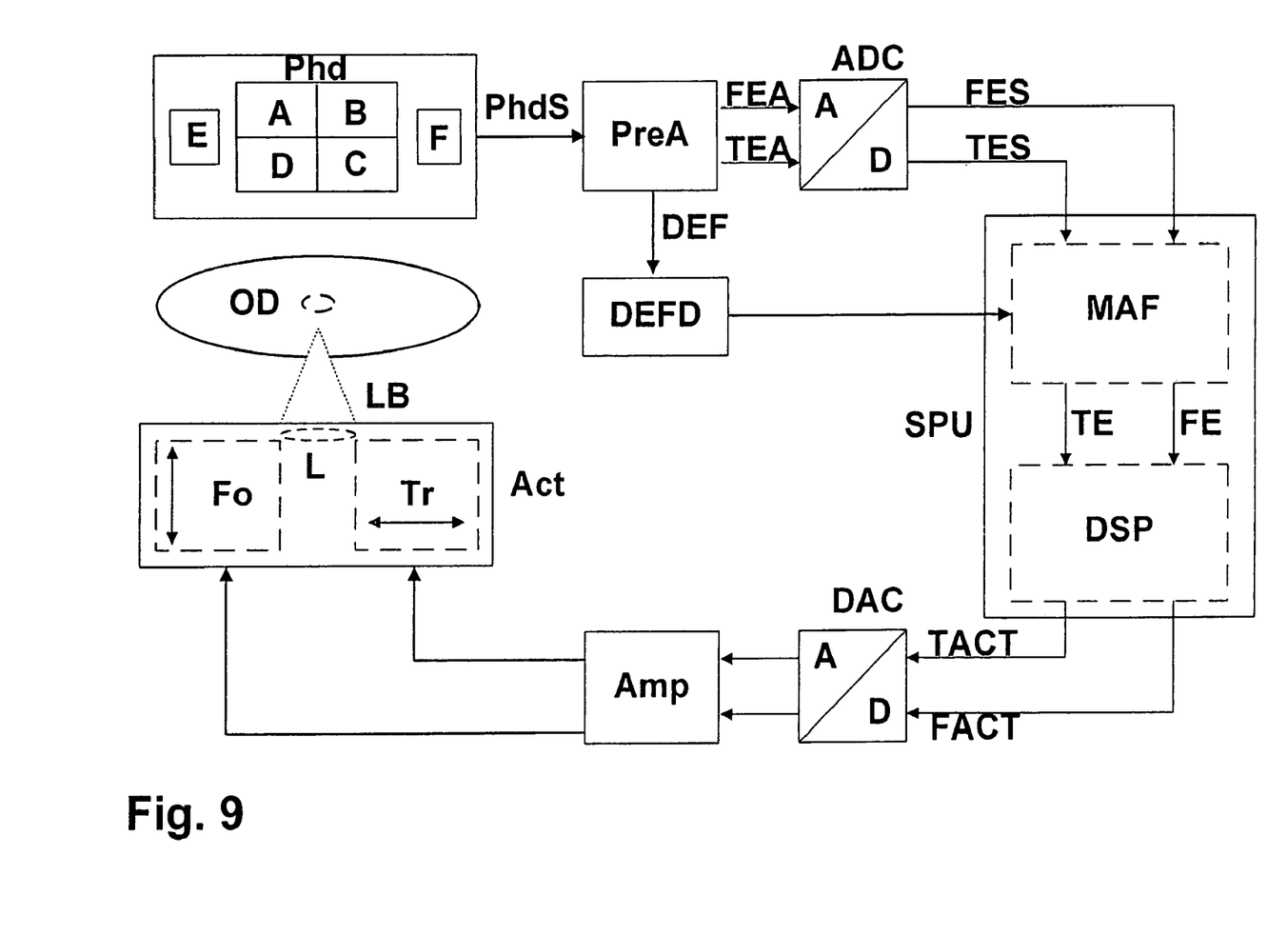
FIG. 9 is a block diagram of a disc drive with defect signal generation in front of a servo signal processing unit and FIG. 10 is a block diagram of a disc drive with a defect signal generation in a servo signal processing unit.
Figure 10:
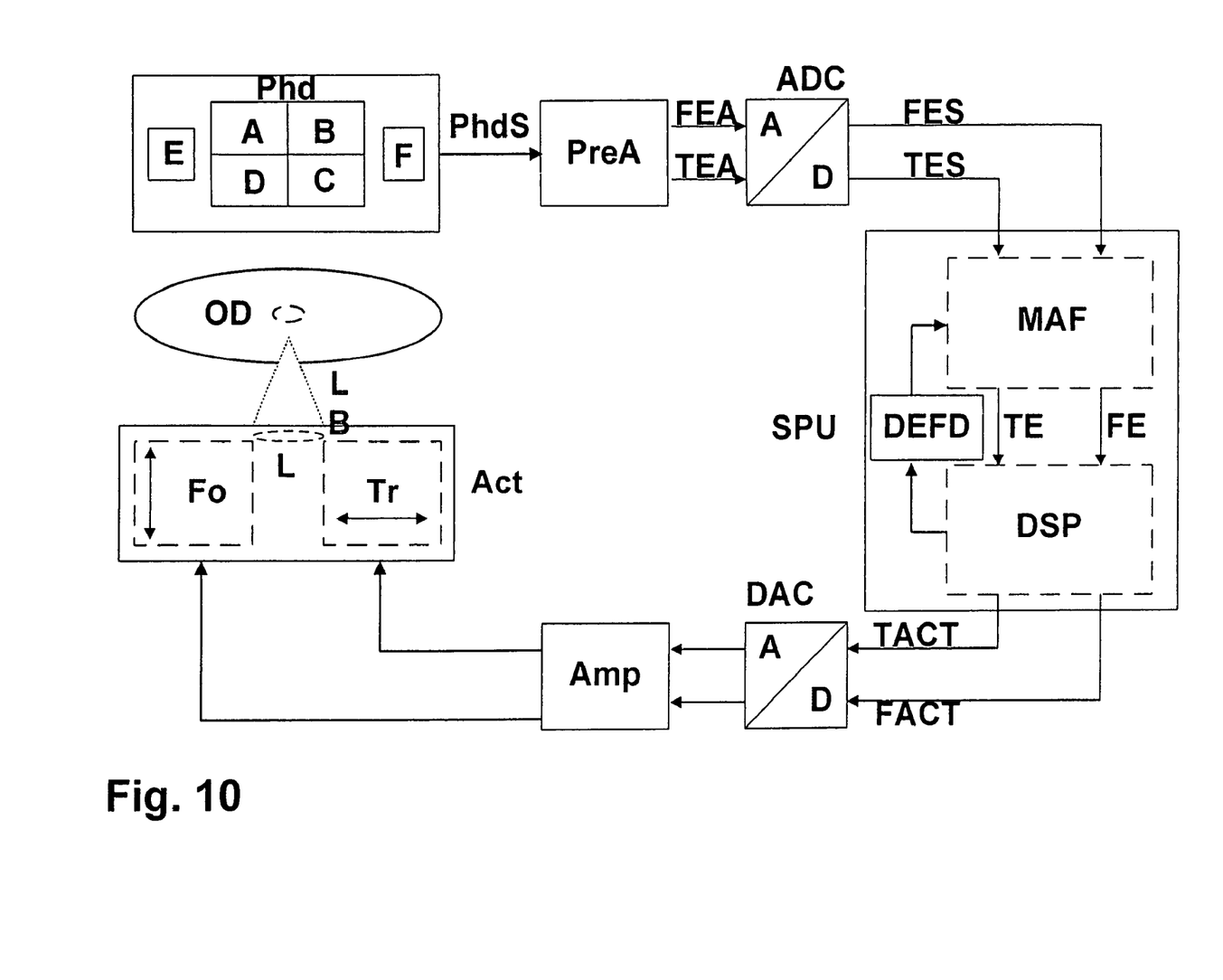

FIG. 2 shows as an exemplary embodiment a block diagram of a disc drive with a digital servo system according to the invention. A disc drive spins the optical disc OD, which has one or more information layer. The information layer of the optical disc OD has a spiral track from which a laser beam LB has to read data or in which a laser beam LB shall write data. An actuator Act, which is controlled by a focus actuator coil Fo and a tracking actuator coil Tr is provided to follow the spiral track. The movable part of said actuator Act comprises a lens L for focusing the laser beam LB on a track and for track following. The light reflected from the optical disc OD generates photo detector signals PhdS e.g. provided by segments A, B, C, D, E, and F of a photodetector Phd and a preamplifier PreA magnifies the photo detector signals PhdS to provide analog error signals indicating in which direction the laser beam LB leaves the track or moves out of focus. The analog focus error FEA and the analog track error TEA signals pass an analog digital converter ADC and digital focus error FES and digital track error TES signals are used as input to a servo processing unit SPU according to the invention. The servo processing unit SPU comprises an input filter MAF and a digital signal processor DSP with moving average filter. The input filter MAF replaces a prior art decimation filter. In the embodiment as shown in FIG. 2 an adjustable moving average filter structure is used as input filter MAF and a digital signal processor DSP with moving average filter is used to decrease the overall processing and sampling delays of the incoming signals. Both increase the phase margin of the focus and track control loops and therefore the stability of the servo system is improved. Pre-processing of old control states means that control output values of the digital signal processor DSP are immediately calculated based on filter states calculated for a value previously processed in the digital signal processor DSP. The digital signal processor DSP delivers the control output values as a digital track actuator signal TACT or a digital focus actuator signal FACT as soon as possible to the actuator Act and calculates afterwards the output of the filter states of the digital signal processor DSP, which are used for the next sample calculation. The control output values of the digital signal processor DSP become digital to analog converted by a digital analog converter DAC and sent via power amplifier Amp to the focus coil Fo and the track coil Tr of the actuator Act to keep the laser spot at the right position. After providing a digital track actuator signal TACT or a digital focus actuator signal FACT the control loop is ready to prepare the next calculation. That means that all calculations for which just the old value is used are performed after the digital track actuator signal TACT or a digital focus actuator signal FACT has been provided. The result of said calculation is stored in one or more memory locations for a fast use in the next calculation of the control output value of the digital signal processor DSP. The digital signal processor DSP is after providing digital track actuator signal TACT or a digital focus actuator signal FACT again free to prepare some data to calculate the second loop by the next sample intervall faster. The intermediate results are stored in the memory for later use and the digital signal processor DSP is ready to calculate the next output values for the two control loops triggered by the loop sampling frequency. After providing a first control output value and preparing the digital signal processor DSP for the next calculation, the next value is taken out of the moving average input filter MAF. With this procedure it is ensured, that no additional delay is added, because the effective delay is again dependent on the filter length m of the moving average input filter MAF which e.g. has been adjusted by a not shown microprocessor according to the requirements in the control loop, which are dependent on the quality of signals detected from the optical disc OD. Said quality is e.g. evaluated according to the occurrence of defects as dropouts or scratches detected from the optical disc OD. That means that the filter length m of the moving average input filter MAF is controlled by a defect dection DEFD as shown in FIG. 2. As more incoming error sample values FES or TES are used in the input filter MAF, so more the control procedure becomes delayed. Therefore, there is always the possibility to decide if it is necessary to have a better filter characteristic by reducing the incoming noise or to prefer a fast processing to increase the phase margin of the control loop. That means if there are defects the filter length m has to be enlarged and if there are no defects, the length can be reduced to get the maximum phase margin of the control loops. In general it is helpful to start with a longer filter length m to close the control loop and than reduce it. Further embodiments of defect dection DEFD are shown in FIG. 9 and FIG. 10. According to FIG. 9, analog defect signals DEF in a known manner generated in the preamplifier PreA are used to determine the filter length m. However, also a so-called digital read path processing, which observes the analog digital converted HF signal and is able to detect defects very fast, can be used to adapt the filter length m of the moving average input filter MAF according to a defect detection DEFD in front of the servo signal processing unit SPU. It is also possible, as shown in FIG. 10, to use a defect dection DEFD signal generated in the digital signal processor DSP. All other means shown in FIGS. 9 and 10 are identically to those in FIG. 2. The advantage of the adjustable moving average input filter MAF is that no unnecessary delay to the servo processing becomes added.

Figure 3:
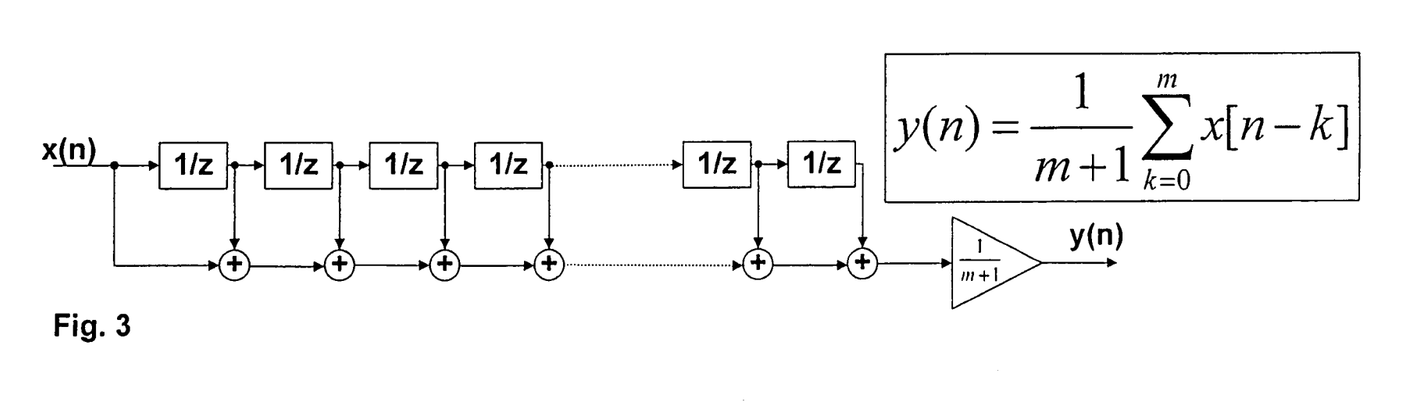
FIG. 3 is a schematic of a non-recursive filter structure.
Figure 4:
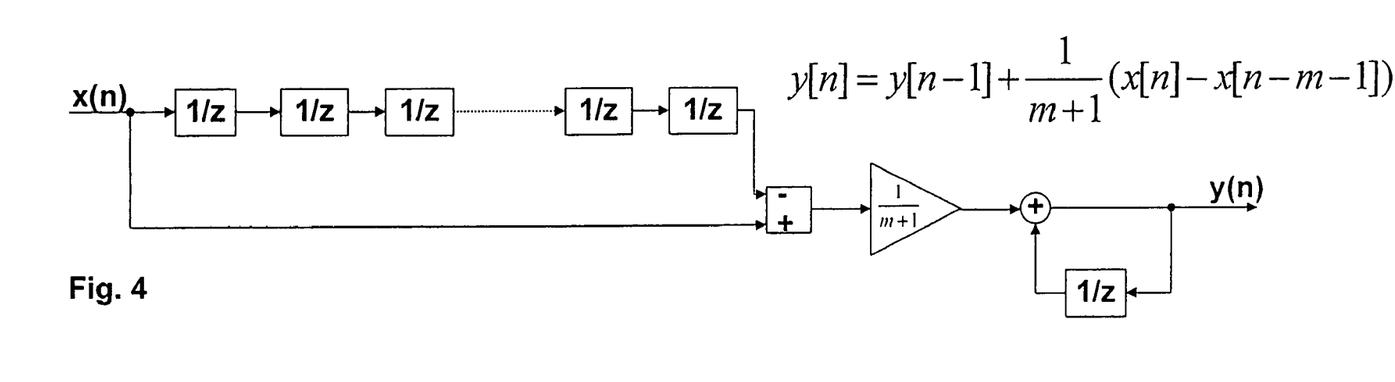
FIG. 4 is a schematic of a recursive filter structure.

A non-recursive filter structure according to FIG. 3 or a recursive filter structure according to FIG. 4 or a filter with a similar timing behaviour can be used as input filter MAF or in other words, every filter which delivers at every clock cycle of the analog digital converter ADC a new averaged value generated from a number n of samples of the analog digital converter ADC can be used. In front of the moving average filter, which is used as input filter MAF, is an analog digital converter ADC which works at a frequency fADC, which is much higher in comparison to a control loop sampling rate fs. This makes it possible to filter incoming error signals as the focus error FE and the track error TE without adding much delay. In both filter configurations used as an example, the sum of the incoming values has to be divided by the filter length m. To make this division easy to handle a filter length m, which is 1 or a multiple of 2 as m=2, 4, 8, 16, 32, 64, 128, ... is prefered. In this case the division can be performed with an ALU by a shift right operation according to the formula shift right by n−1 bits. The non-recursive filter according to FIG. 3 adds incoming values x(n) and an ouput sample y(n) is availabe after a division by 1/(m+1) at the output of the input filter MAF with a delay of trec=m/2*(1/fADC) according to the filter length m and an analog digital converter sample frequency fADC. The number of taps 1/z represents delays according to the filter length m. In such a way an output sample value y (n) forming an avaraged value of incoming values x(n) is available for every incoming value x(n) provided by the analog digital converter ADC.

The delay of a recursive filter according to FIG. 4 is also tnrec=m/2*(1/fADC). An output sample value y(n) of such an input filter MAF has to be calculated by a subtraction of delayed incoming samples from the new sample x(n) according to the formula x[n]−x[n−m−1] followed by a division with the filter length plus 1 according to the formula 1/(m+1) and finally an addition of the recursive part of a tap 1/z. to get the output sample y(n).

Figure 5:
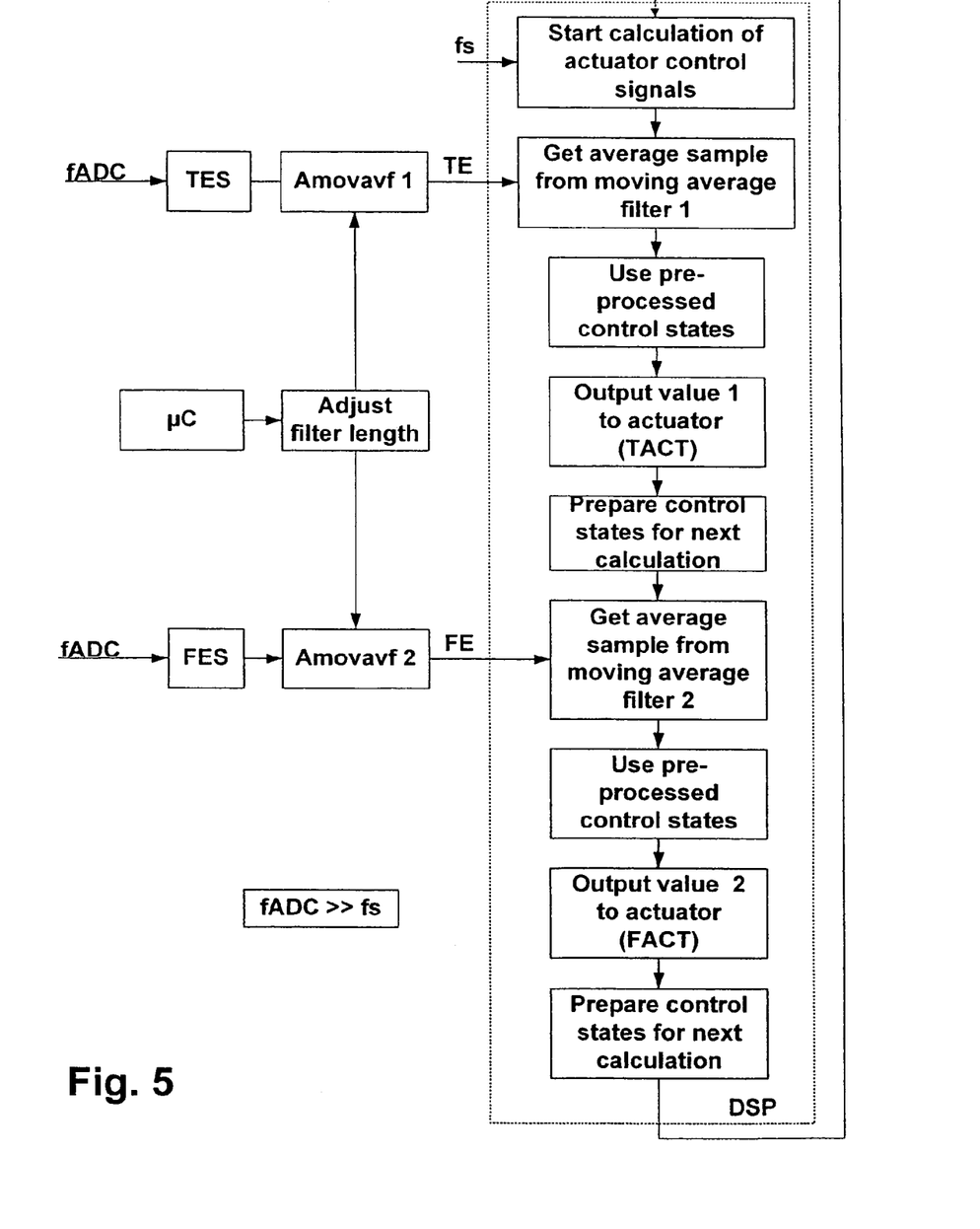
FIG. 5 is a flow chart for a servo signal processing unit according to the invention.

The filter output rate of the input filter MAF corresponds in such a way to the analog digital converter sample frequency fADC, which ensures that the delay time can be decreased wherever it is possible in view of the quality of the signal detected from the optical disc OD. The procedure of calculating the control loops is shown in FIG. 5. The flow chart FIG. 5 illustrates the control method according to the invention. The sampling frequency fs of the control loop calculation in the digital signal processor DSP has to be adjusted according to the application and the performance of the servo system. In future disc drive servo systems with high rotation speeds and thin tracks the bandwidth of the control loop has to be increased to guarantee a proper operation. To increase the bandwidth it is necessary to reduce all process delays to a minimum. This is achieved by the following process, which is illustrated in the flow chart of FIG. 5 and the timing diagram of FIG. 6.

The filter length m of input filter MAF can be adjusted dependent on a defect detection DEFD and/or by a microcontroller μC as illustrated in FIG. 5 and always can be changed according to the requirements of the overall performance. The filter length m adjustment can be done during start up and also during operation of the servo system.

Figure 6:
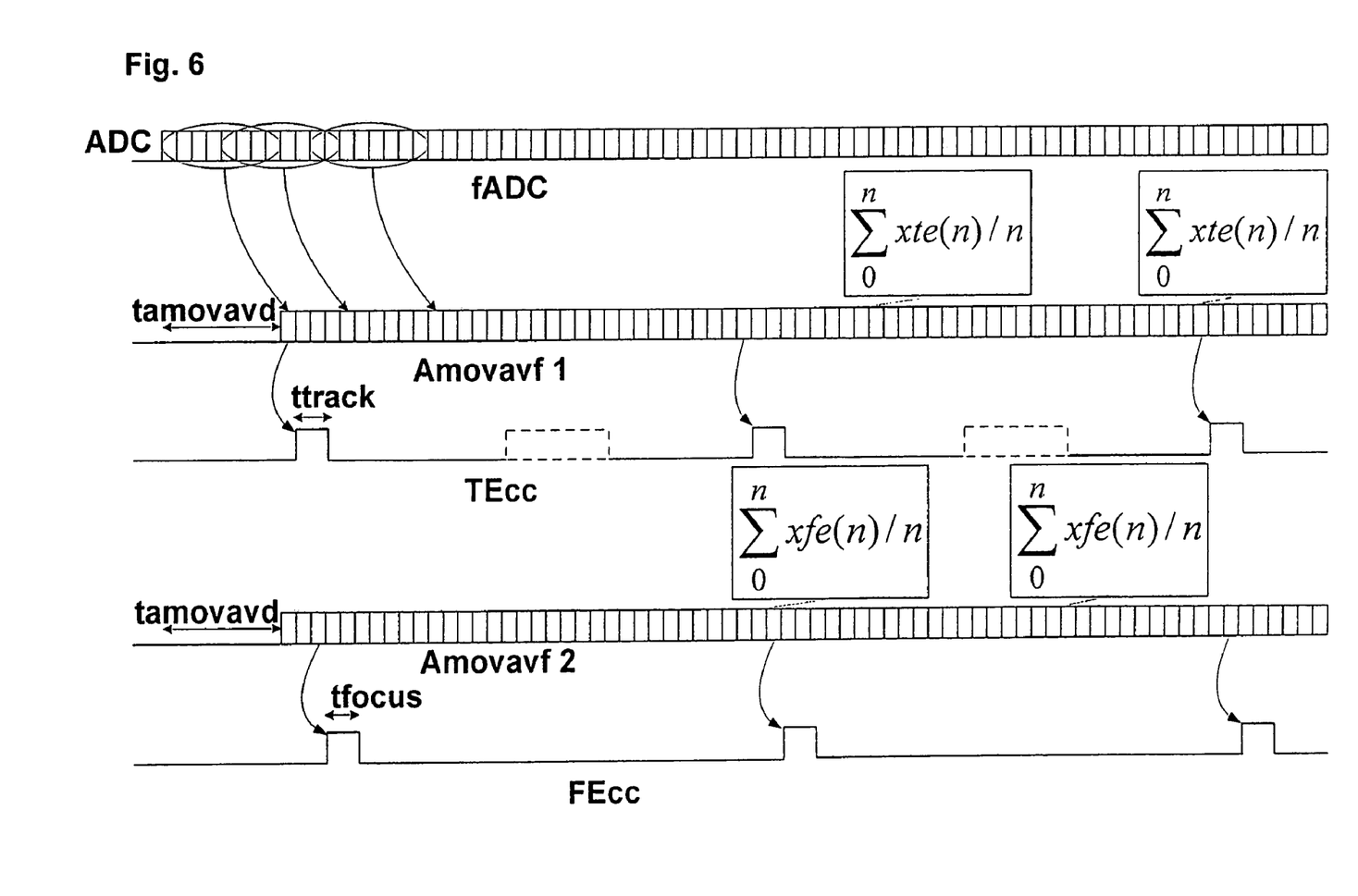
FIG. 6 is a schematic of a timing diagram of a digital servo system according to the invention.

FIG. 5 illustrates that a not shown analog digital converter ADC provides track error signal samples TES and focus error signal samples FES at a frequency according to an analog digital converter sample frequency fADC. A first adjustable moving average filter Amovavf 1 is e.g supplied with said track error signal samples TES and a second adjustable moving average filter Amovavf 2 is e.g supplied with said focus error signal samples FES. The first adjustable moving average filter Amovavf 1 provides then with each incoming sample TES an averaged track error signal TE value and the second adjustable moving average filter Amovavf 2 provides with each incoming sample FES an averaged focus error signal FE value. It is therefore ensured that each time a continuously updated track error signal TE average value and a continuously updated focus error signal FE average value are available which can be processed in a digital signal processor DSP. This circumstance is furthermore supported by the fact that an analog digital converter sample frequency fADC is much higher than a control loop sampling rate fs. The calculation of a digital track actuator signal TACT and a digital focus actuator signal FACT takes place in the digital signal processor DSP at said control loop sampling rate fs. An average value of the track error signal TE is loaded from the output of the first moving average filter Amovavf 1 and pre-processed old control states are used to calculate the digital track actuator signal TACT in the digital signal processor DSP, so that in a fast calculation a first output value 1, which in this example is the digital track actuator signal TACT, is provided for the actuator Act. That means that advantageously no delay occurs in processing an average value of the track error signal TE and an actual non-delayed track error signal TE is used in the servo control loop. The advantage of this configuration is, that the delay of the input filter MAF, which in this embodiment is the first adjustable moving average filter Amovavf 1 is directly dependent on the filter length m. This means, that new filtered values at every clock cycle of the analog digital converter ADC are available and a delay tamovavd, shown in FIG. 6 is fixed according to an adjusted filter length m. A filter length m of said first moving average filter Amovavf 1 and said second moving average filter Amovavf 2 is according to FIG. 5 e.g. separate or common adjustable by a microcontroller pC and/or dependent on a defect detection DEFD as mentioned above. The first control loop is calculated immediately with the loaded averaged input value and said pre-processed old control states. As soon as the processed value is ready it will be sent via an digital analog converter DAC and amplifier Amp or so-called driver to the actuator Act. After this, the first control loop can be prepared for the next calculation of actuator control signals. This means that all control filter value calculations in the digital signal processor DSP for which the old value is needed for are executed later on and the result of said calculation is stored in one or more memory locations for a fast use in the next calculation. This can be done immediately after the digital signal processor DSP provides a first output value 1 as shown in FIG. 5 or later on after e.g. a second output value 2 for a further control loop has been calculated and provided by the digital signal processor DSP. The principle is based on the method to provide as soon as possible a control signal for the actuator Act and to calculate afterwards the filter states or filter coefficients and control filter values for the digital signal processor DSP, which afterwards shall be used for a next sample calculation. This requires a specific arrangement in the core of a digital signal processor DSP and will be exemplary illustrated for a PID controller realised with said digital signal processor DSP. A digital signal processor DSP is a device that is similar to a microprocessor or microcontroller, except that the internal central processor unit has been optimised for use in applications involving discrete-time signal processing. In addition to standard microprocessor instructions, digital signal processors DSP usually support a set of specialized instructions, like multiply-and-accumulate, to perform common signal-processing computations quickly. A Neuman or Harvard architecture, featuring separate code as well as data memories are often used to speed data throughput. A PID servo system as an embodiment of the invention will be illustrated with reference to FIG. 7 and FIG. 8. The abbreviation PID stands for proportional-integral-derivative and PID control loop parameters are proportional gain Pb, integral gain Ib and derivative gain Db.

Figure 7:
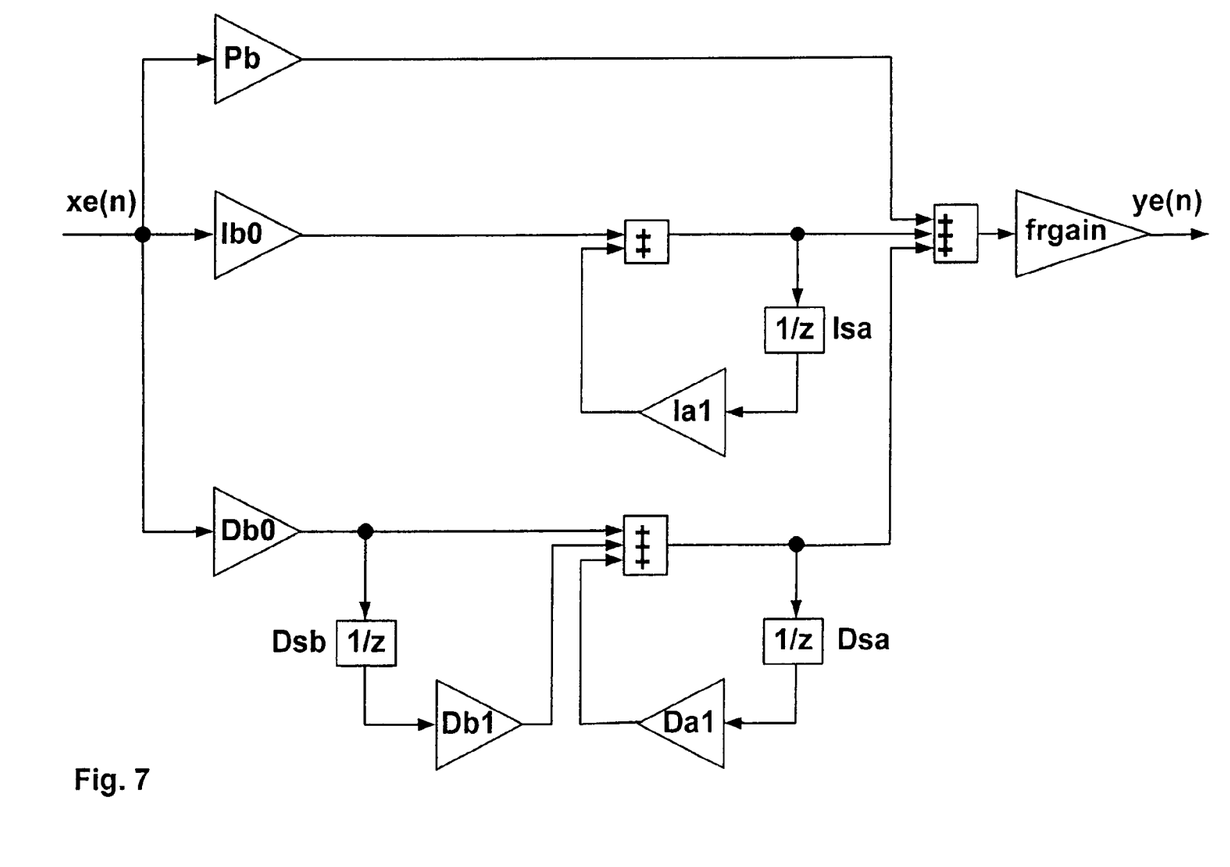
FIG. 7 is a schematic of a PID servo controller.

Proportional gain Pb determines the contribution of restoring force directly proportional to the position error. Integral gain Ib determines the contribution of restoring force that increases with time, ensuring that the static position error in the servo loop is forced to zero and derivative gain Db determines the contribution of restoring force proportional to the rate of change or derivative of position error. Derivative gain Db determines the damping effects of the system. FIG. 7 shows the PID servo architecture and FIG. 8 the flowchart of the PID method according to the invention. A digital signal processor DSP uses an arithmetic logic unit and can access data of x- and y-memories, illustrated as x-RAM and y-RAM in FIG. 8, within one clock cycle of the core frequency of the digital signal processor DSP. The x-memory is used to store the states of a filter and the y-memory is used to store the coefficients according to the application. Both memories can be addressed by pointers. In this embodiment of the invention a first pointer R2 and a second pointer R5 are used and the addressing modifier type is modulo. The digital signal processor DSP has a multiply and accumulate unit with an accumulator where calculation results can be stored in a first accumulator a or a second accumulator b for further use. The PID servo architecture according to FIG. 7 needs only three memory locations to store old states Isa, Dsb, Dsa, however, to allow a fast processing a virtual state or an additional memory named Dold is added to store calculated data for a later use. In this embodiment only one additional addressable memory location is required, but if there is a more complex filter structure so many addressable memory locations as necessary can be added to speed up the processing.

Figure 8:
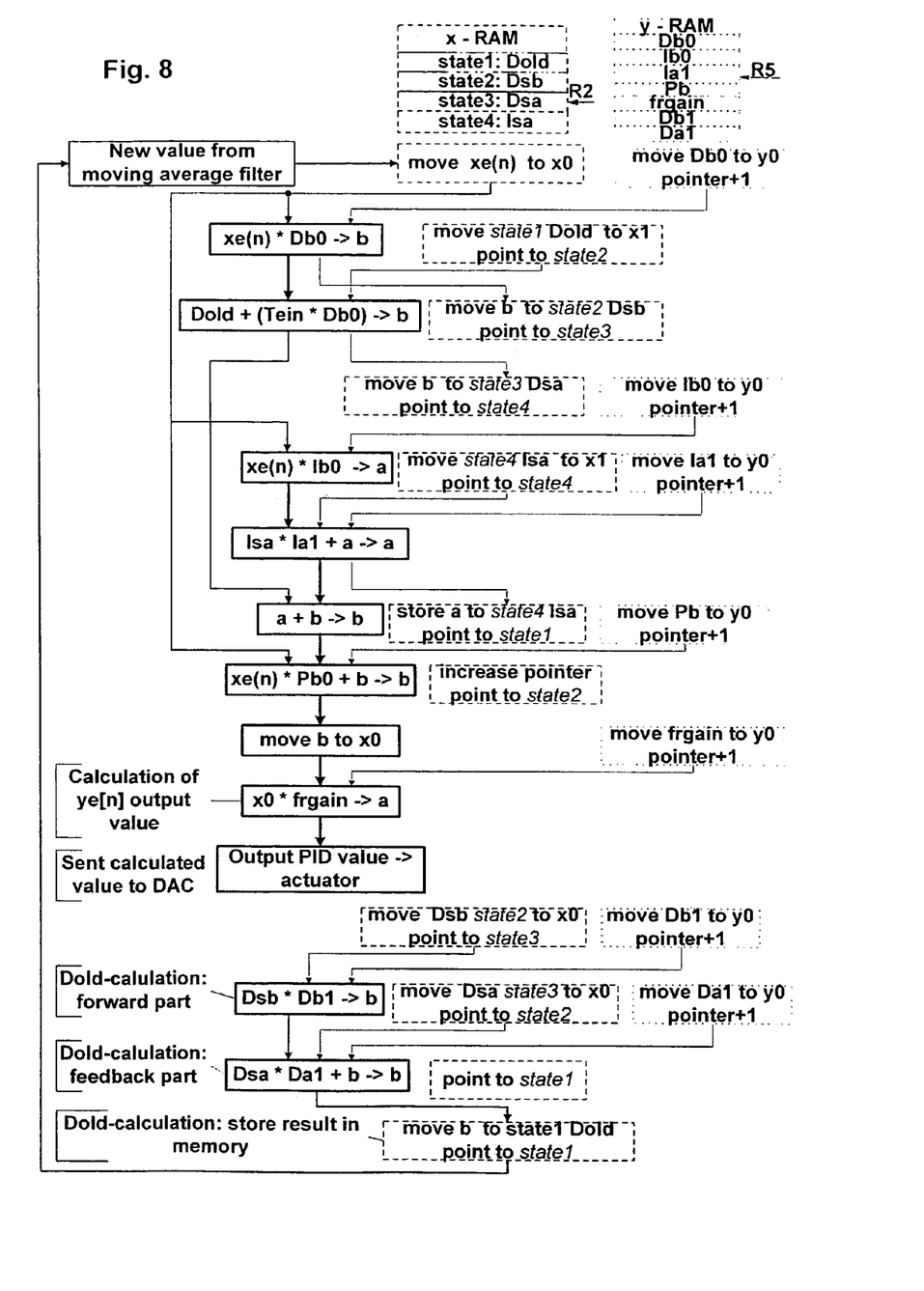
FIG. 8 is a flow chart of a PID servo controller.

The PID servo according to FIG. 8 uses seven coefficients stored in the y-memory: Pb,IbO Ial,DbO,Dbl,Dal,frgain. The arrangement in the memory is selected to speed up the calculation according to the ALU architecture and depends on the core of the digital signal processor DSP.

As shown in FIG. 8, all calculations, which have to be performed in the digital signal processor DSP to determine from an input value xe(n) a digital output sample ye(n), are executed at first. A digital output sample ye(n) represents according to the selected embodiment with two control loops a digital track actuator signal TACT or a digital focus actuator signal FACT and the input value xe(n) of the digital signal processor DSP is a digital track error signal TE or a digital focus error signal FE, provided from an input filter MAF, which in a preferred embodiment comprises a first adjustable moving average filter Amovavf 1 and a second adjustable moving average filter Amovavf 2. However, it is also possible to use said pre-processing of old control states in connection with other kinds of input filters to shorten the period until a digital output sample ye(n) or a digital track actuator signal TACT and a digital focus actuator signal FACT is available in the control loop to shorten the processing delay, which improve the stability of the control loop and/or allow a fast servo signal processing, which improve the overall servo control performance. No unnecessary processing delay is added by immediately calculation of digital output sample ye(n) and pre-processing old control states, which are necessary for the next input value xe(n) afterwards. Intermediate results are stored at memory locations Dold and can be used for the next incoming input value xe(n) related to the corresponding control loop for tracking or focusing. The same method is used for both control loops. Especially if a more complicated control filter has to be used, the recommended method and structure of the digital signal processor DSP will result in more decreased delay. Decreasing delay by filtering with a moving average filter as well as the use of moving average filter in the digital signal processor DSP results in an increase of the phase margin and therefore in a more robust control loop, which is an important feature for optical disc drives with high rotation speed and for reproducing or recording optical discs OD having a high data capacity. A microcontroller uC can adjust the filter length m according to the occurrence of defects as scratches, dust or disturbance signals, however, always the fastest possible processing of deviations or error values is ensured in the control loop. The invention is applicable for all controllers, which have to calculate more than one loop with a single digital signal processor DSP and where the phase margin is limited and shall not be decreased by a slow signal processing.

It is understood that the invention is not limited to this exemplary embodiment and that specified features can also expediently be combined or modified without departing from the scope of the present invention. The input filter MAF and the digital signal processor DSP described here are given as examples only and a person skilled in the art may realise other embodiments of the invention while remaining in the scope of the invention.

The invention claimed is:

1. Digital servo system with moving average filter comprising:
   a servo signal processing unit,
   servo means controlled by said servo signal processing unit;
   an analog digital converter for receiving detector signals indicating a deviation from a target of said servo means and providing to the servo signal processing unit samples representing said deviation, wherein said servo signal processing unit comprises:
   an input filter providing average values of samples at a frequency corresponding to a sample frequency of the analog digital converter and
   a digital signal processor applied to said input filter for controlling said input filter according to the sample frequency of the control loop frequency of the digital servo system and for calculating and storing filter control states, wherein
   said servo signal processing unit, for each new sample received from the filter is adapted for calculating a digital signal processor output value as output of the digital signal processor and for calculating and storing the new filter states for the next received sample after providing an output value and before receiving a next sample from the input filter.

2. Digital servo system according to claim 1, wherein said input filter is a moving average filter providing average values of samples at a frequency corresponding to a sample frequency of the analog digital converter.

3. Digital servo system according to claim 1, wherein said input filter has a recursive filter structure.

4. Digital servo system according to claim 1, wherein said input filter has a non-recursive filter structure.

5. Digital servo system according to claim 1, wherein said input filter is a moving average filter having an adjustable filter length, which varies according to a quality of detector signals indicating a deviation from a target of said servo means.

6. Digital servo system according to claim 1 , wherein said input filter is a moving average filter having an adjustable filter length and said filter lengths is determined according to a defect detection signal and/or by a microcontroller.

7. Digital servo system according to claim 6, wherein said defect detection signal to adapt the filter length is generated before the servo signal processing unit.

8. Digital servo system according to claim 6, wherein said defect detection signal to adapt the filter length is generated in the digital signal processor of the servo signal processing unit.

9. Digital servo system according to claim 1, wherein said servo means are a track coil and a focus coil of an actuator to control a light spot on an optical disc and detector signals indicating a deviation from a target of said servo means are provided from a photo detector.

10. Digital servo system according to claim 1, wherein the digital signal processor stores previously calculated control filter states for a calculation of a digital signal processor output value from an average value provided from the input filter and provides the digital signal processor output value before calculating control filter states based on said average value representing said deviation to control said servo means.

11. Digital servo system according to claim 1. wherein the digital signal processor is applied to said input filter for controlling the filter length of said input filter according to the sample frequency of the analog digital converter and for calculating and storing filter control states.

* * * * *